United States Patent
Yeh

(10) Patent No.: US 8,251,714 B2
(45) Date of Patent: Aug. 28, 2012

(54) SOCKET ASSEMBLY HAVING CLIP AND ARTICULATED LEAF SELECTIVELY INTERLOCKED WITH STIFFENER

(75) Inventor: Cheng-Chi Yeh, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 368 days.

(21) Appl. No.: 12/689,251

(22) Filed: Jan. 19, 2010

(65) Prior Publication Data
US 2010/0184308 A1 Jul. 22, 2010

(30) Foreign Application Priority Data
Jan. 20, 2009 (TW) .............................. 98201017 U

(51) Int. Cl.
*H01R 12/00* (2006.01)
(52) U.S. Cl. ......................................... 439/73; 439/330
(58) Field of Classification Search .............. 439/71–73, 439/330–31, 342, 259, 261, 266
See application file for complete search history.

(56) References Cited

U.S. PATENT DOCUMENTS

| 4,692,790 A * | 9/1987 | Oyamada ...................... 257/727 |
| 4,761,140 A * | 8/1988 | Geib ................................ 439/71 |
| 5,785,535 A * | 7/1998 | Brodsky et al. ................. 439/73 |
| 6,685,494 B1 * | 2/2004 | McHugh et al. .............. 439/342 |
| 7,179,092 B2 | 2/2007 | Hai |

\* cited by examiner

*Primary Examiner* — Khiem Nguyen
(74) *Attorney, Agent, or Firm* — Ming Chieh Chang; Wei Te Chung; Andrew C. Cheng

(57) ABSTRACT

An electrical connector is adapted for electrically connecting an electronic package (3) to a circuit board. The electrical connector includes an insulative housing (11), a stiffener (13) supporting the insulative housing and formed with a stopper (137), a clip (30) formed with a depressing portion (34), and a leaf (50) formed with an anchor (52). The clip is mounted on the stiffener and is pivotable between a first position and a second position. The leaf is mounted on the clip and is pivotable between the second position and a locked position. When the leaf is positioned at the locked position, the anchor is blocked by the stopper and the depressing portion of the clip depresses the electronic package.

11 Claims, 9 Drawing Sheets

SOCKET ASSEMBLY HAVING CLIP AND ARTICULATED LEAF SELECTIVELY INTERLOCKED WITH STIFFENER

BACKGROUND OF THE INVENTION

1. Field of the Invention

The present invention relates to a socket assembly, and more particularly to a socket assembly including a clip rotationally mounted onto a stiffener and a leaf articulated to a base and selectively interlocked to the stiffener at two different positions and disengaged therefrom.

2. Description of Related Art

A conventional socket connector comprises a housing, a stiffener surrounding the housing and formed with an engaging portion, a cover rotatably mounted on the housing and having a tongue portion, and a leaf engaging with the tongue portion of the cover. When an IC package is received by the housing, the cover is rotated from an opened position to a closed position to fasten the IC package at the closed position via engagement between the leaf and the engaging portion of the stiffener. The stiffener has a first end and an opposite second end. The cover is mounted at the first end and extends all the way to the second end to facilitate its function of pressing the IC package against the housing. U.S. The conventional socket connector could be found in U.S. Pat. No. 6,877,990 which was issued to Liao on Apr. 12, 2005, or in U.S. Pat. No. 7,001,197 which was issued to Shirai on Feb. 21, 2006, or in U.S. Pat. No. 7,179,092 which was issued to Ma on Feb. 20, 2007.

The IC package is thus depressed by the cover and is fixed at the closed position. It would require a substantial piece of material to produce such a cover.

Hence, a socket connector having improved leafs is required to overcome the above-mentioned disadvantages of the related art.

SUMMARY OF THE INVENTION

An object of the present invention is to provide an electrical connector using less material.

To achieve the aforementioned objects, a socket connector is adapted for electrically connecting an electronic package to a circuit board. The socket connector includes an insulative housing for receiving an electronic package, a stiffener supporting the insulative housing and formed with a stopper, a first and a leafs. The clip has opposite first and second ends and a depressing portion. The first end of the clip is mounted on the stiffener. The clip is pivotable between a first position and a second position. The leaf is mounted on the second end of the clip and is pivotable between the second position and a locked position. The leaf is formed with an anchor. When the leaf is positioned at the locked position, the anchor is blocked by the stopper and the depressing portion of the clip depresses the electronic package.

The electronic package can be firmly fastened to the closed position and removed easily under a pivotable movement of the first and leafs. The clip performs a function of depressing or releasing the electronic package. The clip has a small dimension and does not extend from one end of the stiffener to the opposite end of the stiffener. Thus, it would cost less material to manufacture such clip.

Other objects, advantages and novel features of the invention will become more apparent from the following detailed description of a preferred embodiment when taken in conjunction with the accompanying drawings.

DETAILED DESCRIPTION OF THE INVENTION

Figure 1:
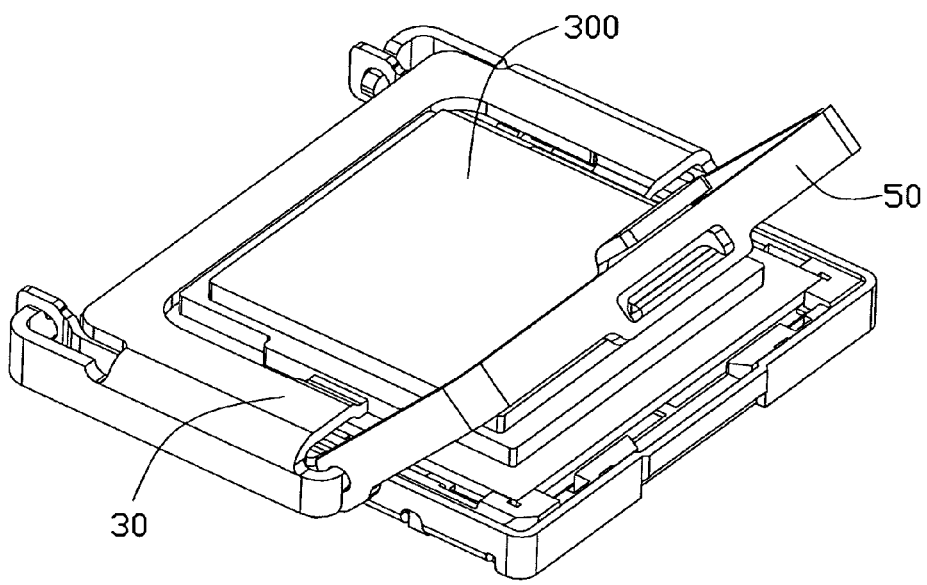
FIG. 1 is an assembled perspective view showing a socket connector connecting with an IC package in accordance with the present invention.

Reference will now be made to the drawing figures to describe the present invention in detail. Referring to FIGS. 1-5, a socket connector 100 in accordance with the preferred embodiment of the present invention comprises an insulative housing 11 electrically connecting an IC package 300 to a circuit board (not shown), a stiffener 13 strengthening the insulative housing 11, a clip 30 rotationally mounted on an end of the stiffener 13, and a leaf 50 articulated to a free end of the clip 30.

Figure 2:
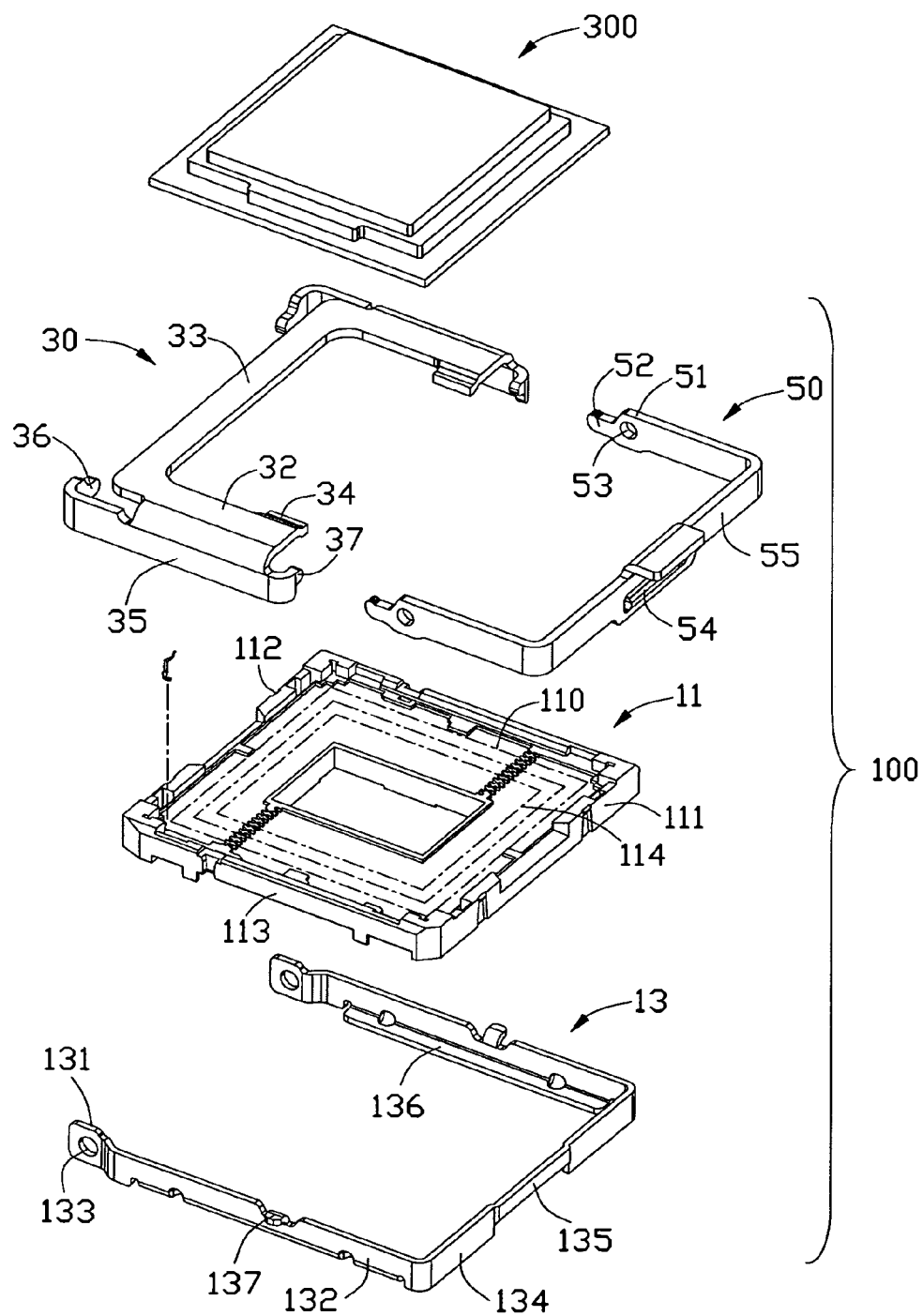
FIG. 2 is an exploded perspective view of the socket connector and the IC package as shown in FIG. 1.

Referring to FIG. 2, the insulative housing 11 comprises a base wall 114, a front wall 111, a rear wall 112 and a pair of side walls 113 rising from the base wall 114, and a receiving space 110 defined therebetween.

The stiffener 13 comprises a pair of first plate portion 132 and a second plate portion 134 between the pair of first plate portions 132. Each first plate portion 132 has a connecting portion 131 formed at free end thereof. Each connecting portion 131 has a first mounting hole 133 defined therein. Each first plate portion 132 is formed with an outwardly extending stopper 137. Each first plate portion 132 is formed with an inwardly extending skirt 136. The second plate portion 132 has a latching portion 135 formed at a middle portion thereof. The insulative housing 11 is disposed between the pair of first plate portions 132 with the bottom of the insulative housing 11 sitting onto the skirts 136 (see FIG. 8). The first plate portion 132 is longer than the insulative housing 11 such that the first mounting holes 133 are located beyond the insulative housing 11.

The clip 30 is rotationally assembled to the first mounting holes 133, and substantially covers half of the insulative housing 11 when the clip 30 is closed to the insulative housing 11. The clip 30 is substantially U-shaped and comprises a pair of first beam portions 32, a first handle 31 disposed between the pair of first beam portions 32, and a pair of connecting beams 35 extending from the first beams portions 32 respectively. Each first beam portion 32 is formed with an inwardly extending depressing portion 34. The depressing portion 34 has a small dimension and depresses an outer edge of the IC package 300. Each connecting beam 35 has a first mounting portion 36 and a second mounting portion 37 formed at opposite ends of the connecting beam 35.

The leaf 50 is articulated to a free end of the clip 30 in a way that the leaf 50 can rotate with respect to the free end of the clip 30. The leaf 50 is substantially U-shaped and comprises a pair of second beam portions 51 and a second handle 55 disposed between the pair of second beam portions 51. Each second beam portion 51 has an anchor 52 extending from the second beam portion 51 and a second mounting hole 53 defined in the second beam portion 51. The second handle 55 has a locking portion 54 formed at a middle portion thereof.

Referring to FIGS. 1-4, in assembling of the socket connector 100, the insulative housing 11 is mounted in the stiffener 13. The insulative housing 11 is disposed between the pair of the first plate portions 132 and supported by the skirts 136. The latching portion 135 is disposed adjacent to the front wall 111. The clip 30 is mounted on the stiffener 13, with the first mounting portions 36 inserted through the first mounting holes 133. The clip 30 is pivotable about the first mounting portions 36. The leaf 50 is mounted on the clip 30, with the second mounting holes 53 engaging with the second mounting portions 37. The leaf 50 is pivotable about the second mounting portions 37.

Figure 3:
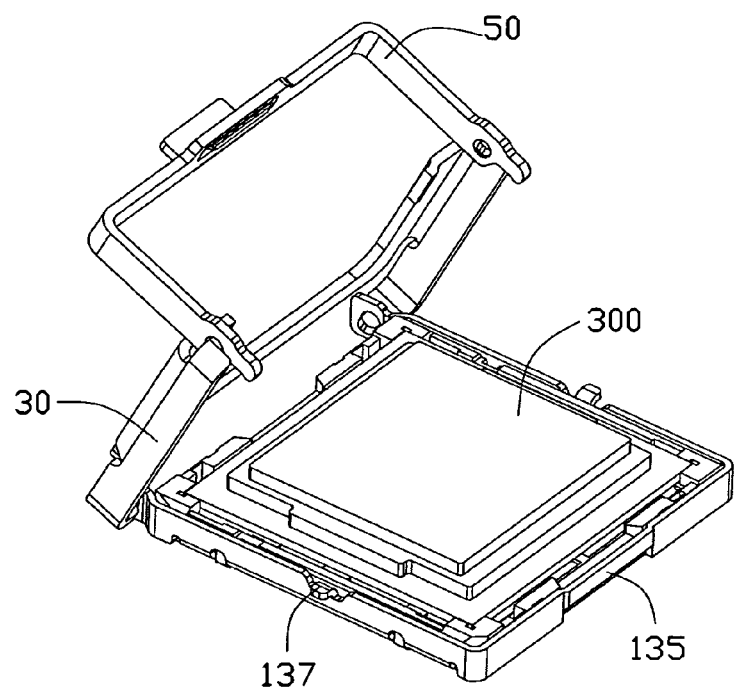
FIG. 3 is an assembled perspective view of the socket connector and the IC package as shown in FIG. 1, when the first and leafs are disposed in opened position.
Figure 4:
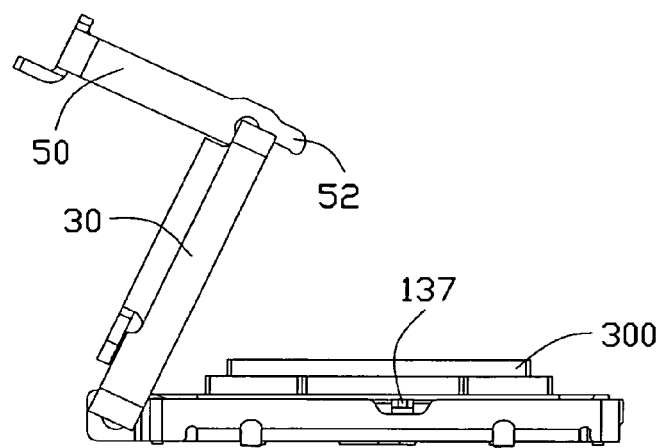
FIG. 4 is a side view of the socket connector and the IC package as shown in FIG. 3.

Referring to FIGS. 3 and 4, when the clip 30 and the leaf 50 are not depressed, i.e., at its opened position, the IC package 300 can be positioned in the receiving space 110 of the insulative housing 11.

Figure 5:
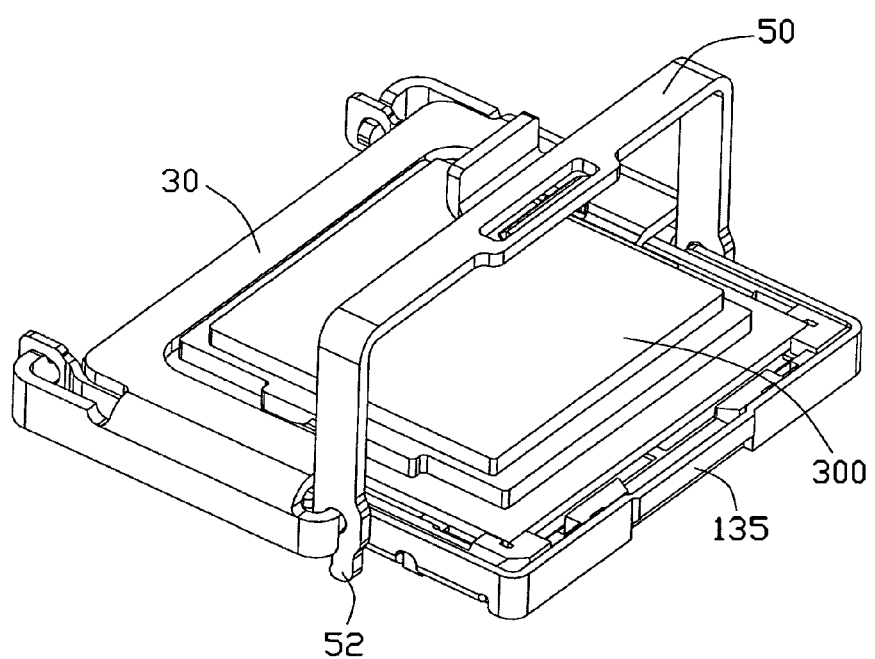
FIG. 5 is a perspective view of the socket connector and the IC package as shown in FIG. 1, when the clip and the leaf are disposed at the half-closed position.
Figure 6:
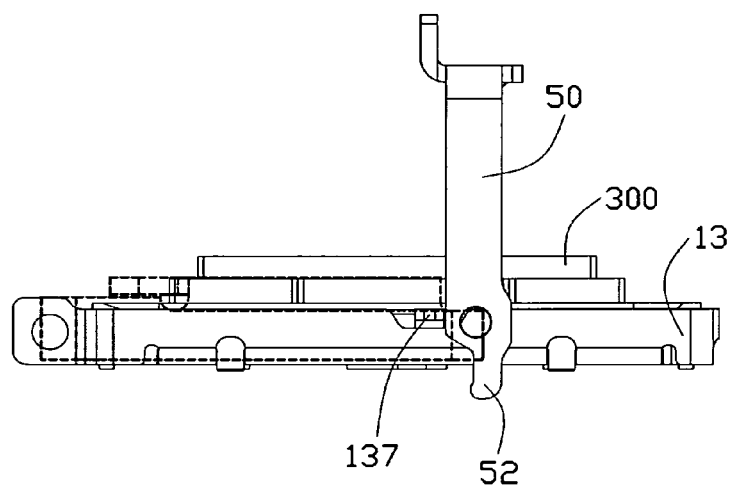
FIG. 6 is a side view of the socket connector and the IC package as shown in FIG. 5, with the clip being removed.

Referring to FIGS. 5-6, when the clip 30 is actuated to pivot about the first mounting portions 36 till a half-closed position, i.e., a position where the connecting beams 35 of the clip 30 are in parallel to the first plate portions 132 of the stiffener 30. The angle between the clip 30 and the leaf 50 is kept less than ninety degree. In conjunction with FIG. 6, the anchors 52 are disposed forward of the stopper 137 and not in contact with the stopper 137.

Figure 7:
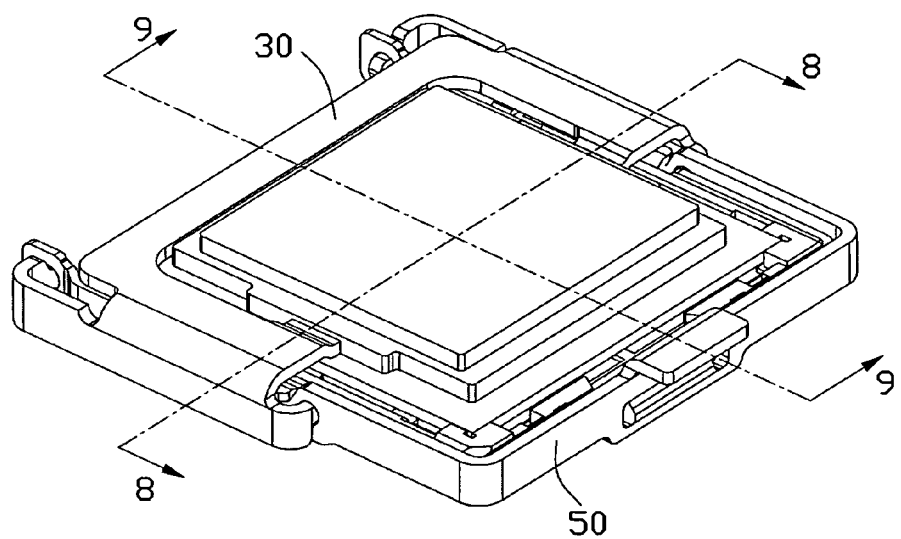
FIG. 7 is an assembled perspective view of the socket connector and the IC package as shown in FIG. 1, when the first and leafs are disposed at the closed position.
Figure 8:
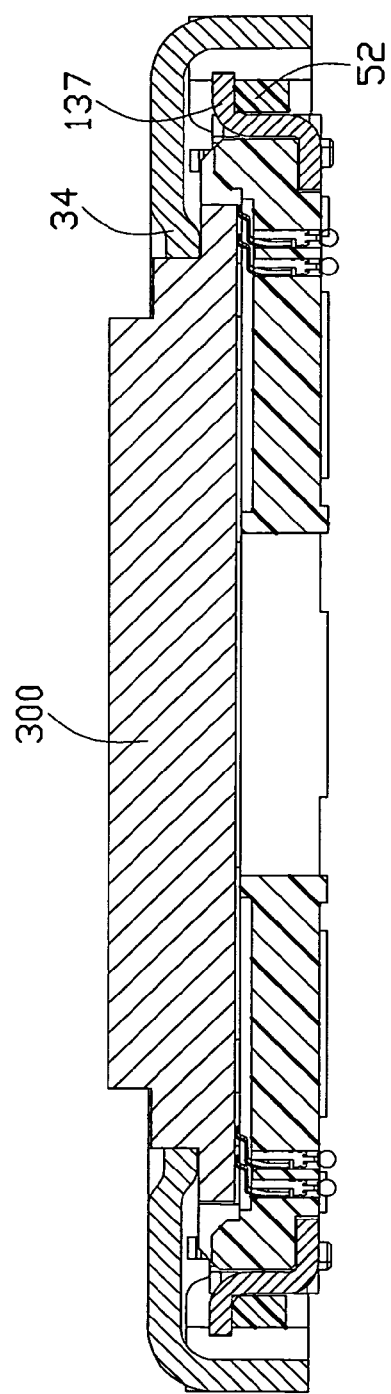
FIG. 8 is a cross-sectional view of the socket connector and the IC package, taken along line 8-8 of FIG. 7.
Figure 9:
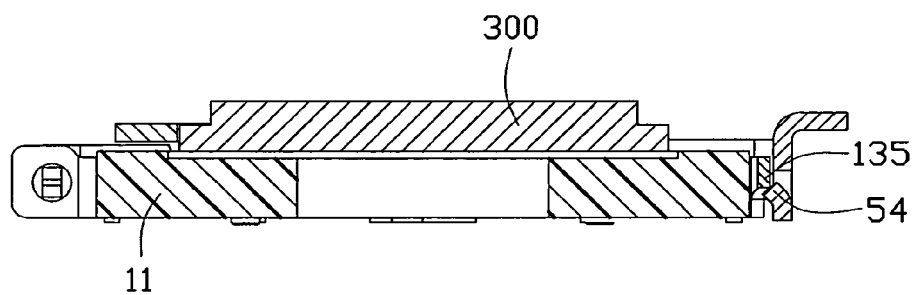
FIG. 9 is a cross-sectional view of the socket connector and the IC package, taken along line 9-9 of FIG. 7.

After the IC package 300 is disposed in the insulative housing 11, the clip 30 is closed that the IC package 300 is covered half by the clip 30. Referring to FIGS. 7-8, when the leaf 50 is operated to pivot around the second mounting portions 37 till a closed position, i.e., a position where the second beam portions 51 of the leaf 50 are in parallel to the first plate portions 132 of the stiffener 30. The anchors 52 are disposed below and blocked by the stoppers 137. In conjunction with FIG. 9, the locking portion 54 is locked with the latching portion 135. The depressing portions 34 of the clip 30 depress the IC package 300 tightly.

When the IC package 300 is to be removed from the socket connector 100, the leaf 50 is disengaged and separated from the stiffener 13, and is pivoted from the closed position to the half-closed position. The clip 30 is then pivoted from the half-closed position to the opened position. The IC package 3 could be removed from the socket connector 100 easily.

The clip 30 is mounted at a first location of the stiffener 13, where the first mounting holes 133 are formed. When the clip 30 is pivoted to the half-closed position, the second mounting portions 37 of the clip 30 arrives at a second location of the stiffener 13, which is disposed adjacent to the stopper 137. When the leaf 50 is pivoted the closed position, the second handle 55 arrives at a third location of the stiffener 13, which is disposed adjacent to the latching portion 135. The dimension along the front-to-back direction of the clip 30 is only half of that of the stiffener 13. The clip 30 has a small dimension and depresses an outer edge of the IC package 3. A resilient force provided by the clip 30 is exerted to the IC package 300 to realize desired mechanical advantage between load and effort. It would also cost less material to manufacture such clip 30.

Optionally, the clip 30 could be formed with one latching portion 135.

However, the disclosure is illustrative only, changes may be made in detail, especially in matter of shape, size, and arrangement of parts within the principles of the invention.

What is claimed is:

1. An electrical connector for electrically connecting an electronic package to a circuit board, comprising: an insulative housing for receiving an electronic package; a stiffener supporting the insulative housing and formed with a stopper; a clip having opposite first and second ends and a depressing portion, the first end of the clip mounted on the stiffener, the clip being pivotable between a first position and a second position; and a leaf mounted on the second end of the clip and pivotable between the second position and a locked position, the leaf being formed with an anchor, when the leaf is positioned at the locked position, the anchor is blocked by the stopper and the depressing portion of the clip depresses the electronic package, wherein said stiffener defines a pair of first mounting holes, said clip is formed with a pair of first mounting portions inserted in the first mounting holes and is pivotable about the first mounting portions, wherein said clip is substantially U-shaped and comprises a pair of first beam portions, a first handle between the pair of first beam portions and a pair of connecting beams connected with the pair of first beam portions respectively, wherein said depressing portion is formed on one of the pair of first beam portions, and the other one of the pair of first beam portions is formed with another depressing portion.

2. The electrical connector as claimed in claim 1, wherein each connecting beam is formed with opposite first and second tips, said first mounting portion being formed at the first tip.

3. The electrical connector as claimed in claim 2, wherein said second tip of the connecting beam is formed with a second mounting portion, and wherein said leaf is formed with a pair of second mounting holes engaging with the second mounting portions of the clip, said leaf being pivotable about the second mounting portions.

4. The electrical connector as claimed in claim 3, wherein said leaf is substantially U-shaped and comprises a pair of second beam portions and a second handle between the pair of second beam portions, the anchor and the second mounting hole being defined on the second beam portion.

5. The electrical connector as claimed in claim 4, wherein said stiffener comprises a pair of first plate portions and a second plate portion between the pair of first plate portions.

6. The electrical connector as claimed in claim 5, wherein said first beam portions of the clip are in parallel to the first plate portions of the stiffener when the clip is disposed at the second position.

7. The electrical connector as claimed in claim 5, wherein said second beam portions of the leaf are in parallel to the first plate portions of the stiffener when the leaf is disposed at the locked position.

8. The electrical connector as claimed in claim 5, wherein said second handle of the leaf is formed with a locking portion, and said second plate portion of the stiffener is formed with a latching portion locking with the locking portion.

9. An electrical connector assembly comprising: an insulative housing defining opposite first and second housing ends in a longitudinal direction; a receiving cavity formed in an upper face of the housing; a metallic clip defining opposite first and second pivot ends in said longitudinal direction, said first pivot end pivotally mounted around the first housing end so as to have said second pivot end moveable in a rotational manner with regard to the housing around a middle portion of the housing;

and a metallic leaf defining opposite linking end and locking end; wherein said linking end is pivotally mounted to the second pivot end, and the locking end latched around the second housing end when said leaf is rotationally moved to a horizontal position for holding an electronic package in said receiving cavity, further including a stopper located around a middle portion of the housing to lock a anchor formed at the link end of the leaf so as to not only have said leaf downward pressed but also have the clip downward pressed due to linking between the linking end and the second pivot end, further including a metallic stiffener having two opposite ends respectively assembled with the first pivot end of the clip and the locking end of the leaf, wherein said stiffener essentially fully surrounds said housing.

10. The electrical connector assembly as claimed in claim 9, wherein said clip is equipped with a depressing portion for downwardly abutting against the electronic package while said leaf is not.

11. The electrical connector assembly as claimed in claim 9, wherein said clip and said leaf are roughly dimensioned with one half of the housing in said longitudinal direction, respectively.

\* \* \* \* \*